(12) United States Patent
Glascock et al.

(10) Patent No.: US 9,646,857 B2
(45) Date of Patent: May 9, 2017

(54) LOW PRESSURE ENCAPSULANT FOR SIZE-REDUCED SEMICONDUCTOR PACKAGE

(71) Applicant: Qorvo US, Inc., Greensboro, NC (US)

(72) Inventors: Howard Terry Glascock, Graham, NC (US); Frank Juskey, Apopka, FL (US); Thomas Scott Morris, Lewisville, NC (US); Charles E. Carpenter, Orlando, FL (US); Robert Hartmann, Apopka, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/236,586

(22) Filed: Aug. 15, 2016

(65) Prior Publication Data

US 2017/0047232 A1    Feb. 16, 2017

Related U.S. Application Data

(60) Provisional application No. 62/205,051, filed on Aug. 14, 2015.

(51) Int. Cl.
*H01L 21/00* (2006.01)
*H01L 21/56* (2006.01)
(Continued)

(52) U.S. Cl.
CPC .......... *H01L 21/565* (2013.01); *H01L 23/293* (2013.01); *H01L 23/3114* (2013.01); *H01L 25/0655* (2013.01); *H01L 25/50* (2013.01)

(58) Field of Classification Search
None
See application file for complete search history.

(56) References Cited

U.S. PATENT DOCUMENTS 6,001,672 A    12/1999  Wensel
6,503,433 B2    1/2003  Chandra
(Continued)

OTHER PUBLICATIONS

Author Unknown, "Wafer Level Packaging," TriQuint, available at least as early as Apr. 29, 2016, 2 pages, http://www.triquint.com/about-us/innovation/wafer-level-packaging.
(Continued)

*Primary Examiner* — Calvin Choi
(74) *Attorney, Agent, or Firm* — Withrow & Terranova, P.L.L.C.

(57) ABSTRACT

The present disclosure relates to a packaging process using a low pressure encapsulant. According to an exemplary process, an assembly including a substrate, a surface mounted device (SMD) mounted on the substrate, and a space between the SMD and the substrate is provided. The SMD has a sealed cavity biased towards the substrate. A sheet mold compound is laid over the SMD and the assembly is heated such that the sheet mold compound transitions to a liquid phase to form a molten mold compound. Next, the assembly is subjected to a vacuum that creates a negative atmosphere allowing the molten mold compound to flow towards the top surface of the substrate and about the SMD. The molten mold compound is then pressed towards the substrate at a low pressure (<=2 Mpa) such that the space between the SMD and the substrate is substantially filled and the SMD is substantially encapsulated.

22 Claims, 12 Drawing Sheets

(51) Int. Cl.
    *H01L 25/065*    (2006.01)
    *H01L 25/00*    (2006.01)
    *H01L 23/31*    (2006.01)
    *H01L 23/29*    (2006.01)

(56) References Cited

U.S. PATENT DOCUMENTS

2010/0052082 A1\* 3/2010 Lee ................... B81B 7/0061
    257/416
2016/0322283 A1\* 11/2016 McMahon .......... H01L 23/3135

OTHER PUBLICATIONS

Imhoff, Albert C., "Packaging Technologies for RFIC's: Current Status and Future Trends," 1999 IEEE Radio Frequency Integrated Circuits Symposium, Jun. 14-15, 1999, IEEE, pp. 7-10.

Miao, Min et al., "Investigation of a Unified LTCC-based Micromachining and Packaging Platform for High Density/Multi-functional Microsystem Integration," 2012 IEEE 62nd Electronic Components and Technology Conference (ECTC), May 29-Jun. 1, 2012, IEEE, pp. 377-384.

\* cited by examiner

LOW PRESSURE ENCAPSULANT FOR SIZE-REDUCED SEMICONDUCTOR PACKAGE

RELATED APPLICATIONS

This application claims the benefit of U.S. provisional patent application No. 62/205,051, filed Aug. 14, 2015, the disclosure of which is incorporated herein by reference in its entirety.

FIELD OF THE DISCLOSURE

The present disclosure relates to a packaging process, and more particularly to a packaging process using a low pressure encapsulant to enable a size-reduced semiconductor package.

BACKGROUND

In a flip-chip assembly, the coefficient of thermal expansion (CTE) mismatch between a flip-chip die and a substrate, which may result in cracks in solder joints, is a major contributor of reliability concerns. To address this issue, mold compounds are widely used to underfill the flip-chip die. By underfilling the flip-chip die, the mold compounds fill the space between the flip-chip die and the substrate, and encapsulate the solder joints. These mold compounds provide mechanical support to the solder joints. However, presence of the underfill materials between the flip-chip die and the substrate may adversely impact the electronic performance of the flip-chip die, especially for high-frequency flip-chip die.

Accordingly, there remains a need for improved packaging methods to maintain superior electronic performance of the flip-chip die without sacrificing the reliability of the flip-chip die due to cracks in the solder joints. In addition, to accommodate the increased demand of portable communication devices, there is also a strong need to reduce the size of the final semiconductor package.

SUMMARY

The present disclosure relates to a packaging process, which uses a low pressure encapsulant to enable a size-reduced semiconductor package. According to an exemplary process, an assembly that includes a substrate with a top surface, a surface mounted device (SMD) mounted on the top surface of the substrate, and a space between the SMD and the top surface of the substrate is provided. The SMD has a sealed cavity biased towards the top surface of the substrate. A sheet mold compound is then laid over the SMD and portions of the top surface of the substrate about the SMD. Next, the assembly is heated such that the sheet mold compound transitions to a liquid phase to form a molten mold compound. And, the assembly is subjected to a vacuum that creates a negative atmosphere to allow the molten mold compound to flow towards the top surface of the substrate and about the SMD. The molten mold compound is then pressed toward the top surface of the substrate at a low pressure such that the space between the SMD and the top surface of the substrate is substantially filled and the SMD is substantially encapsulated. Herein, the low pressure is no more than 2 Mpa. Finally, the molten mold compound is cured to provide a cured mold compound and a top surface of the cured mold compound is planarized.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

It will be understood that for clear illustrations, FIGS. 1A-1B and FIGS. 3-12 may not be drawn to scale.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1A:
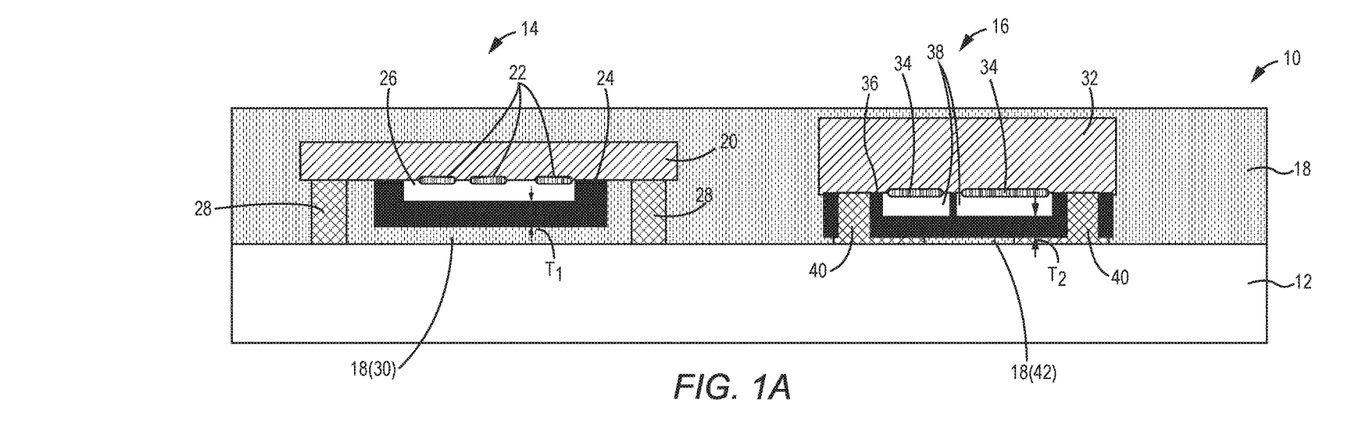
FIGS. 1A-1B provide an exemplary semiconductor package with Wafer Level Packaged (WLP) structures.

In a flip-chip assembly, underfill materials between a flip-chip die and a substrate provide mechanical support to solder joints, but may adversely impact the electronic performance of the flip-chip die, especially for a high-frequency flip-chip die. Wafer Level Packaged (WLP) structures, which introduce sealed cavities to the flip-chip die, may be used in the flip-chip assembly to improve the electronic performance of the flip-chip die, while the underfill materials are still maintained to provide mechanical support to the solder joints. FIG. 1A shows an exemplary semiconductor package 10 with WLP structures. For the purpose of this illustration, the semiconductor package 10 includes a substrate 12, a first surface mounted device (SMD) 14, a second SMD 16, and a mold compound 18. In different applications, the semiconductor package 10 may include fewer or more SMDs. The first and the second SMDs 14 and 16 are mounted on a top surface of the substrate 12. The mold compound 18 covers and underfills the first and the second SMDs 14 and 16.

In detail, the first SMD 14 may be a bulk acoustic wave (BAW) filter device including a first flip-chip die 20 with first electronic components 22 at a bottom surface of the first flip-chip die 20, a first WLP structure 24, a first sealed cavity 26, and two first interconnect structures 28. The first WLP structure 24 is formed at the bottom surface of the first flip-chip die 20 biased towards the top surface of the substrate 12. The first sealed cavity 26 is formed between the bottom surface of the first flip-chip die 20 and the first WLP structure 24. Herein, the first sealed cavity 26 provides the necessary clearance for high-frequency operation of the first flip-chip die 20 due to the first electronic components' 22 exposure to the first sealed cavity 26. The first interconnect structures 28 extend outward from the bottom surface of the first flip-chip die 20 and connect to the top surface of the substrate 12. By underfilling the first SMD 14, the mold compound 18 fills a first space 30 between the first SMD 14 and the top surface of the substrate 12, and encapsulates the first interconnect structures 28. As such, the mold compound 18 provides mechanical support to the first interconnect structures 28.

In addition, the second SMD 16 may be a surface acoustic wave (SAW) filter device including a second flip-chip die 32 with second electronic components 34 at a bottom surface of the second flip-chip die 32, a second WLP structure 36, two second sealed cavities 38, and two second interconnect structures 40. The second WLP structure 36 is formed at the bottom surface of the second flip-chip die 32 biased towards the top surface of the substrate 12. The second sealed cavities 38 are formed between the bottom surface of the second flip-chip die 32 and the second WLP structure 36. Herein, the second sealed cavities 38 provide the necessary clearance for high-frequency operation of the second flip-chip die 32 due to the second electronic components' 34 exposure to the second sealed cavities 38. The second interconnect structures 40 extend outward from the bottom surface of the second flip-chip die 32 and connect to the top surface of the substrate 12. By underfilling the second SMD 16, the mold compound 18 fills a second space 42 between the second SMD 16 and the top surface of the substrate 12, and encapsulates the second interconnect structures 40. As such, the mold compound 18 provides mechanical support to the second interconnect structures 40.

Normally, a thickness T1 of a roof of the first WLP structure 24 needs to be more than 45 μm to accommodate a traditional transfer molding pressure (>=5 Mpa) in an underfilling step, otherwise the first WLP structures 24 may collapse under the traditional transfer molding pressure. Similarly, a thickness T2 of a roof of the second WLP structure 36 needs to be more than 45 μm to accommodate the traditional transfer molding pressure in the underfilling step. Consequently, the first and the second SMDs 14 and 16 are required to be wide/tall enough to hold the thick first and second WLP structures 24 and 36, respectively.

Figure 1B:
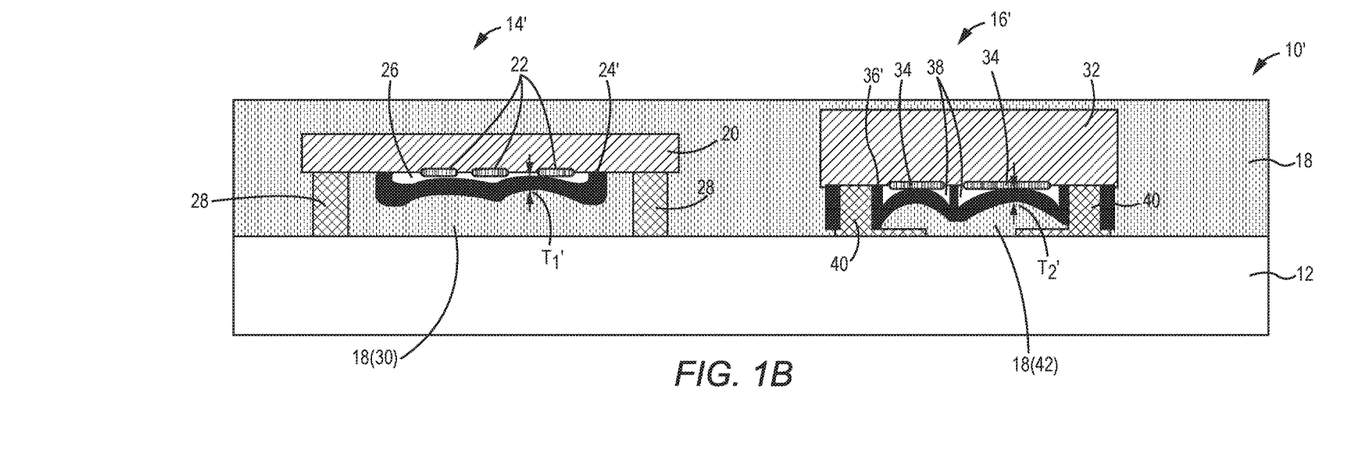

FIG. 1B shows a size-reduced semiconductor package 10' with thin WLP structures. A first WLP structure 24' has a roof with a thickness T1' about 25 μm and a second WLP structure 36' has a roof with a thickness T2' about 25 μm. With the traditional transfer molding pressure (>=5 Mpa) in the underfilling step, the first WLP structure 24' collapses and the first electronic components 22 may be in contact with the collapsed first WLP structure 24'. As such, the first flip-chip die may operate improperly. Similarly, with the traditional transfer molding pressure (>=5 Mpa) in the underfilling step, the second WLP structure 36' collapses and the second electronic components 34 may be in contact with the collapsed second WLP structure 36'. As such, the second flip-chip die 32 may operate improperly.

Figure 2:
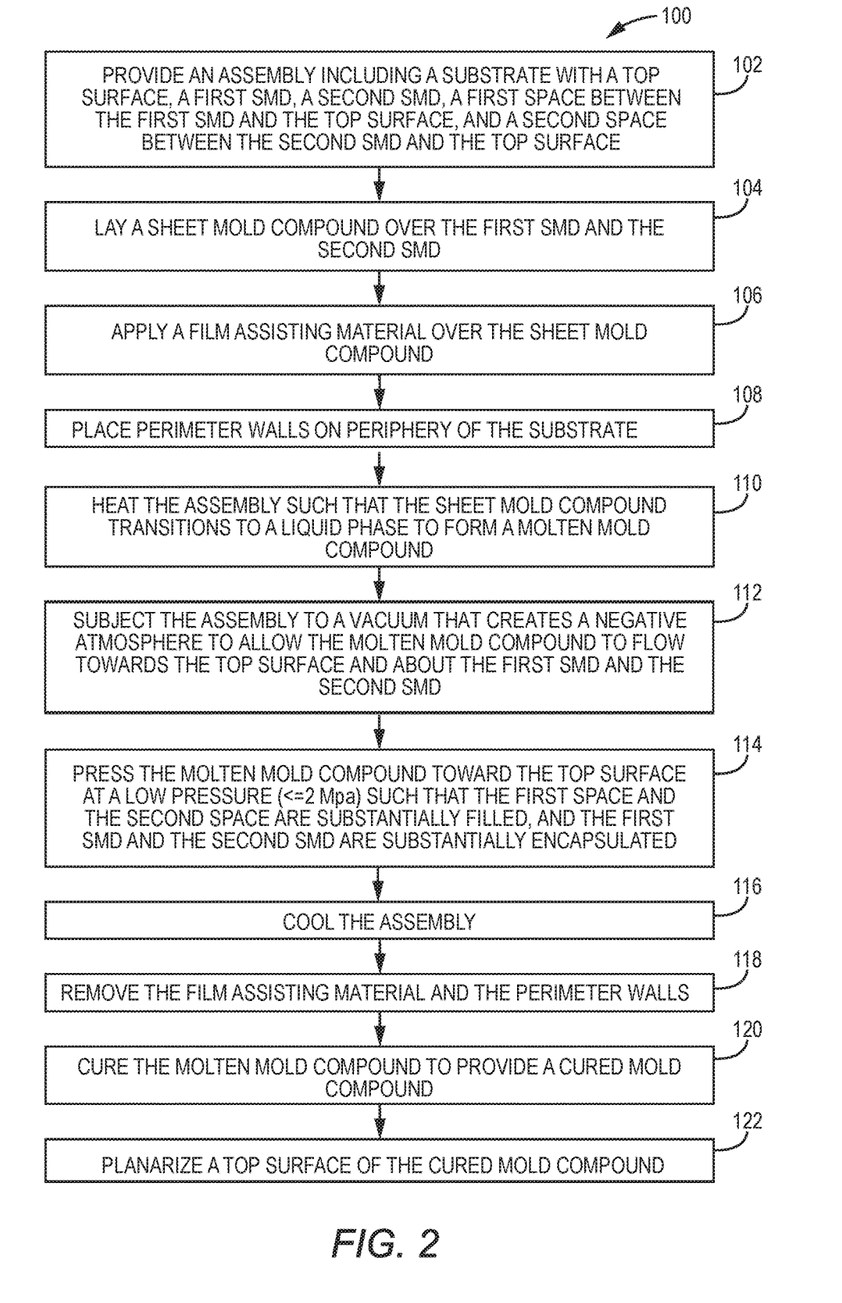
FIG. 2 provides a flow diagram that illustrates an exemplary packaging process according to one embodiment of the present disclosure

In order to shrink the size of a semiconductor package without collapsing the WLP structures, FIG. 2 provides a flow diagram that illustrates an exemplary packaging process 100 according to one embodiment of the present disclosure. FIGS. 3-12 illustrate the steps associated with the packaging process 100 provided in FIG. 2. Although the exemplary packaging process 100 is illustrated as a series of sequential steps, the exemplary packaging process 100 is not necessarily order dependent. Some steps may be done in a different order than that presented. Further, the exemplary packaging process 100 within the scope of the present disclosure may include fewer or more steps than those illustrated in FIG. 2.

Figure 3:
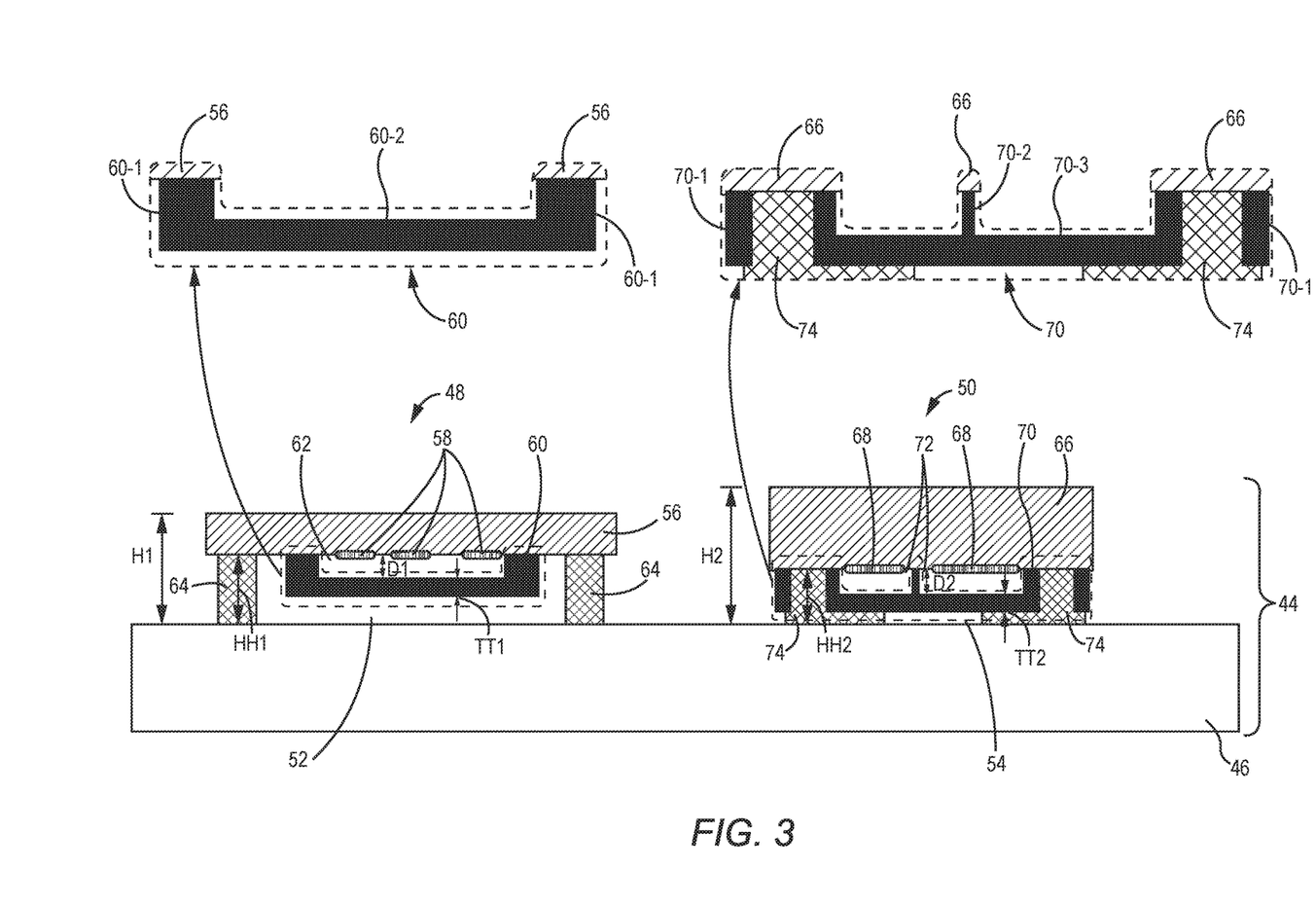
FIGS. 3-12 illustrate the steps associated with the packaging process provided in FIG. 2.

Initially, an assembly 44 that includes a substrate 46, a first SMD 48, a second SMD 50, a first space 52, and a second space 54 is provided as depicted in FIG. 3 (Step 102). In different applications, the assembly 44 may include fewer or more SMDs. The substrate 46 may be formed of laminate (organic or inorganic in composition), ceramic, or other chip carrier materials. The first and the second SMDs 48 and 50 are mounted on a top surface of the substrate 46. The first space 52 is formed between the first SMD 48 and the top surface of the substrate 46; while the second space 54 is formed between the second SMD 50 and the top surface of the substrate 46.

In one embodiment of the present disclosure, the first SMD 48 may be a bulk acoustic wave (BAW) filter device including a first flip-chip die 56 with first electronic components 58 at a bottom surface of the first flip-chip die 56, a first WLP structure 60, a first sealed cavity 62, and two first interconnect structures 64. The first WLP structure 60 may be formed of photosensitive permanent resist film and include first outer walls 60-1 and a first roof 60-2. The first outer walls 60-1 reside at the bottom surface of the first flip-chip die 56 biased towards the top surface of the substrate 46 and the first roof 60-2 covers the first outer walls 60-1 to form the first sealed cavity 62. Herein, the first sealed cavity 62 provides the necessary clearance for high-frequency operation of the first flip-chip die 56 due to the first electronic components' 58 exposure to the first sealed cavity 62. The first interconnect structures 64 extend outward from the bottom surface of the first flip-chip die 56 and connect to the top surface of the substrate 46. The first SMD 48 has a height H1 between 190 μm and 210 μm and the first interconnect structures 64 have a height HH1 between 100 μm and 120 μm. The first outer walls 60-1 have a height D1 (same as a depth of the first sealed cavity 62) between 15 μm and 25 μm, and the first roof 60-2 has a thickness TT1 between 20 μm and 45 μm.

In addition, the second SMD 50 may be a surface acoustic wave (SAW) filter device including a second flip-chip die 66 with second electronic components 68 at a bottom surface of the second flip-chip die 66, a second WLP structure 70, two second sealed cavities 72, and two second interconnect structures 74. The second WLP structure 70 may be formed of photosensitive permanent resist film and include second outer walls 70-1, a second inner wall 70-2, and a second roof 70-3. Both the second outer walls 70-1 and the second inner wall 70-2 reside at the bottom surface of the second flip-chip die 66 biased towards the top surface of the substrate 46. The second roof 70-3 covers the second outer and inner walls 70-1 and 70-2 to form the second sealed cavities 72. Herein, the second sealed cavities 72 provide the necessary clearance for high-frequency operation of the second flip-chip die 66 due to the second electronic components' 68 exposure to the second sealed cavities 72. The second interconnect structures 74 extend outward from the bottom surface of the second flip-chip die 66 and connect to the top surface of the substrate 46. The first SMD 50 has a height H2 between 220 μm and 280 μm, and the second interconnect structures 74 have a height HH2 between 65 μm and 105 μm. The second outer walls 70-1 have a height D2 (same as a depth of the second sealed cavities 72) between 15 μm and 25 μm, and the second roof 70-3 has a thickness TT2 between 20 μm and 45 μm.

Figure 4:
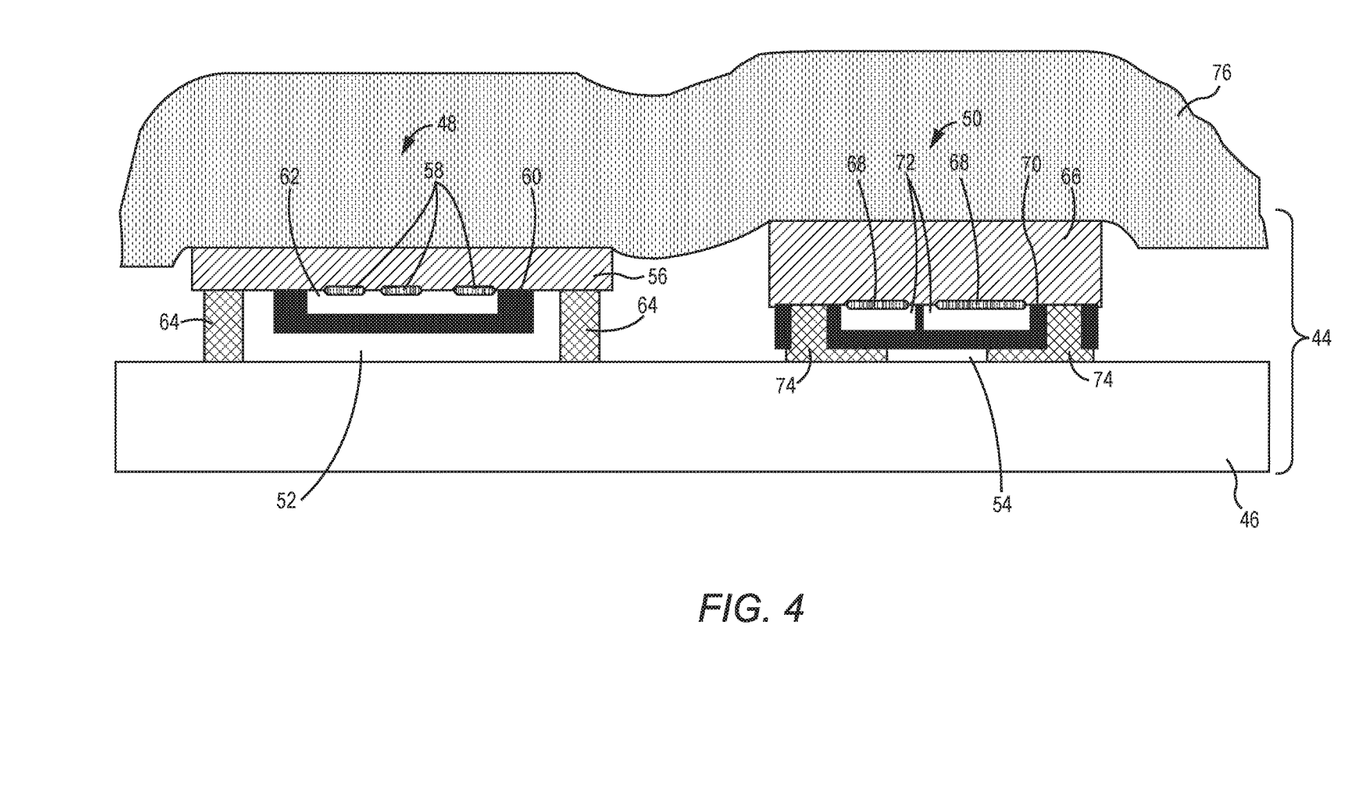

Next, a sheet mold compound 76 is laid over the first and the second SMDs 48 and 50 as depicted in FIG. 4 (Step 104). In some applications, the sheet mold compound 76 may be laid over portions of the top surface of the substrate 46 about the first and the second SMDs 48 and 50. The sheet mold compound 76 may be formed of a thermoset epoxy resin with silica particles. Herein, each of the silica particles has a maximum size no larger than 20 μm, such that the sheet mold compound 76 may be a high flow material in a liquid-phase.

Figure 5:
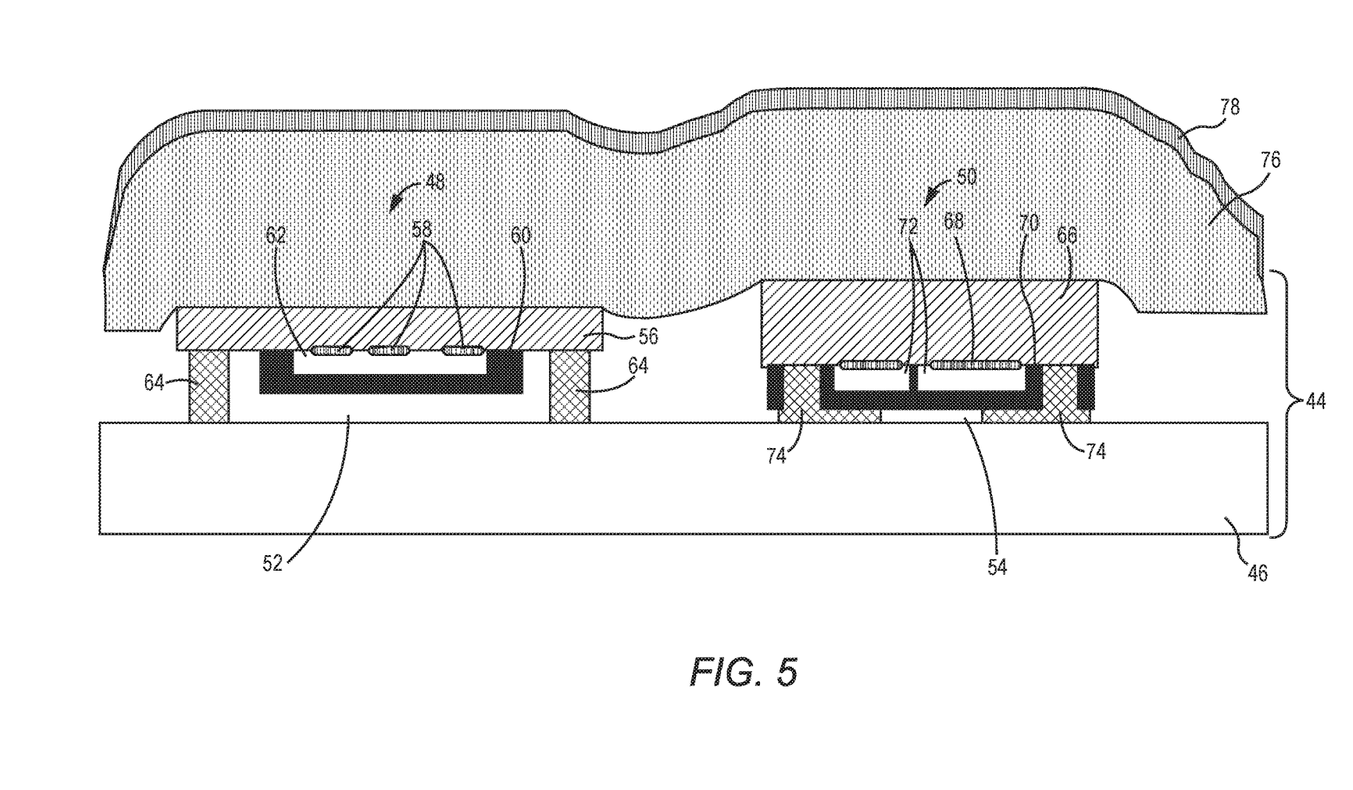
Figure 6:
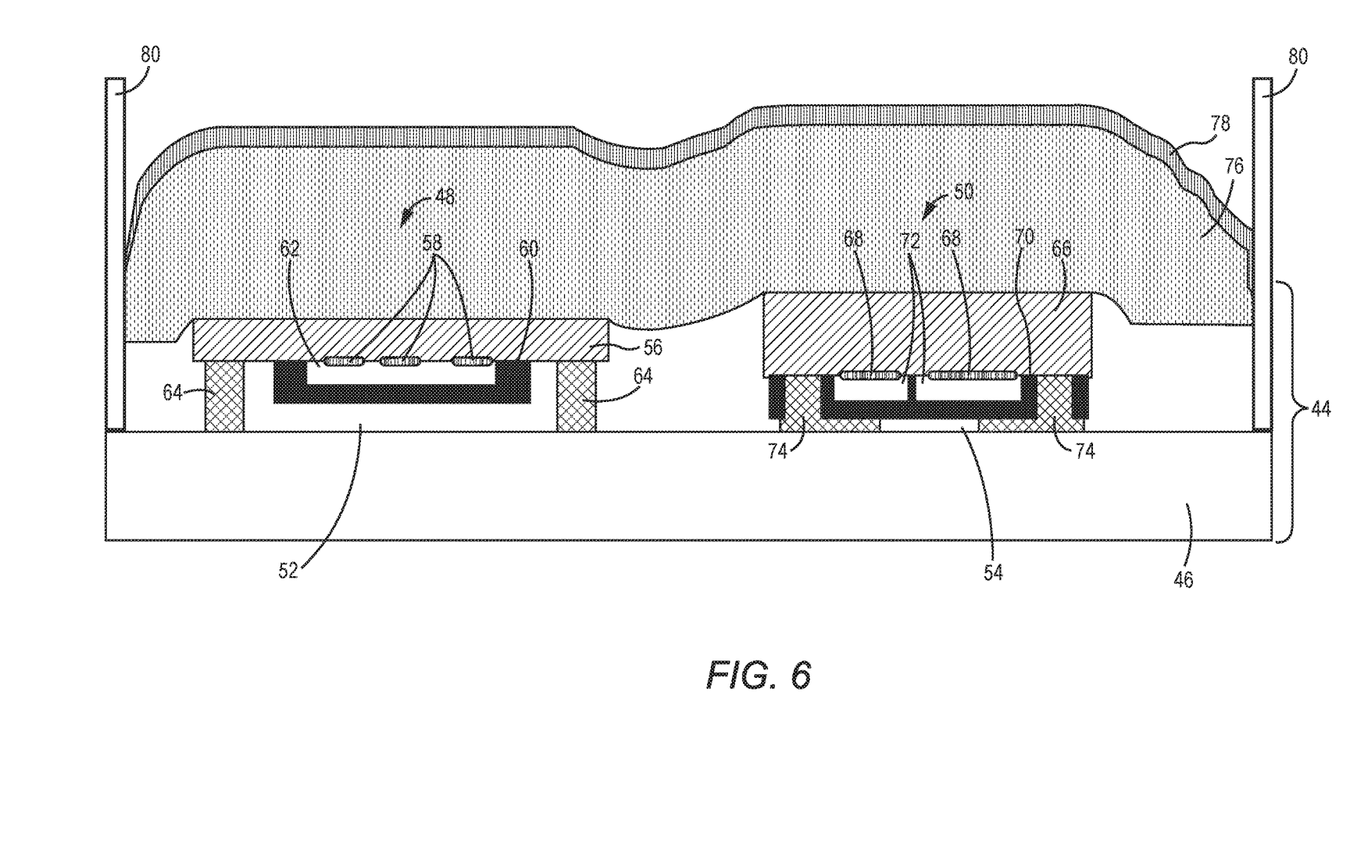

In order to provide protection from subsequent heating and pressing steps, which will be described further below, a film assisting material 78 may be applied over the sheet mold compound 76 as depicted in FIG. 5 (Step 106). The film assisting material 78 may be formed of a polyethylene terephthalate (PET) material, which has a higher melting point than the sheet mold compound 76. Further, perimeter walls 80 may be placed on peripheries of the substrate 46 as depicted in FIG. 6 (Step 108). The perimeter walls 80 may be formed from plastic or metal rings and provide barriers to the sheet mold compound 76 in subsequent heating and pressing steps.

Figure 7:
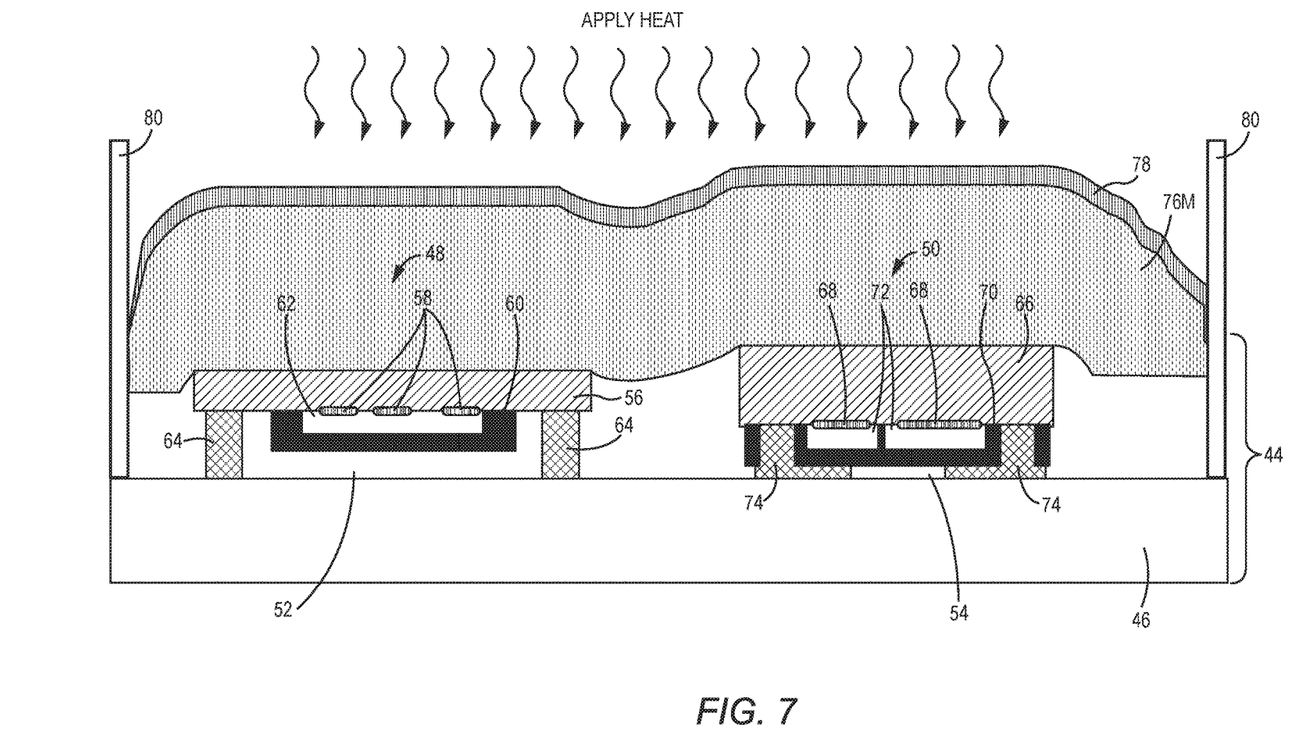

The assembly 44 is then heated as depicted in FIG. 7 (Step 110), at a temperature between 120° C. and 180° C. During the heating step, the sheet mold compound 76 transitions to a liquid phase to form a molten mold compound 76M, which is prevented by the perimeter walls 80 from flowing beyond the periphery of the substrate 46. In addition, the film assisting material 78 does not melt during the heating step and provides a top protection to the molten mold compound 76M.

Figure 8:
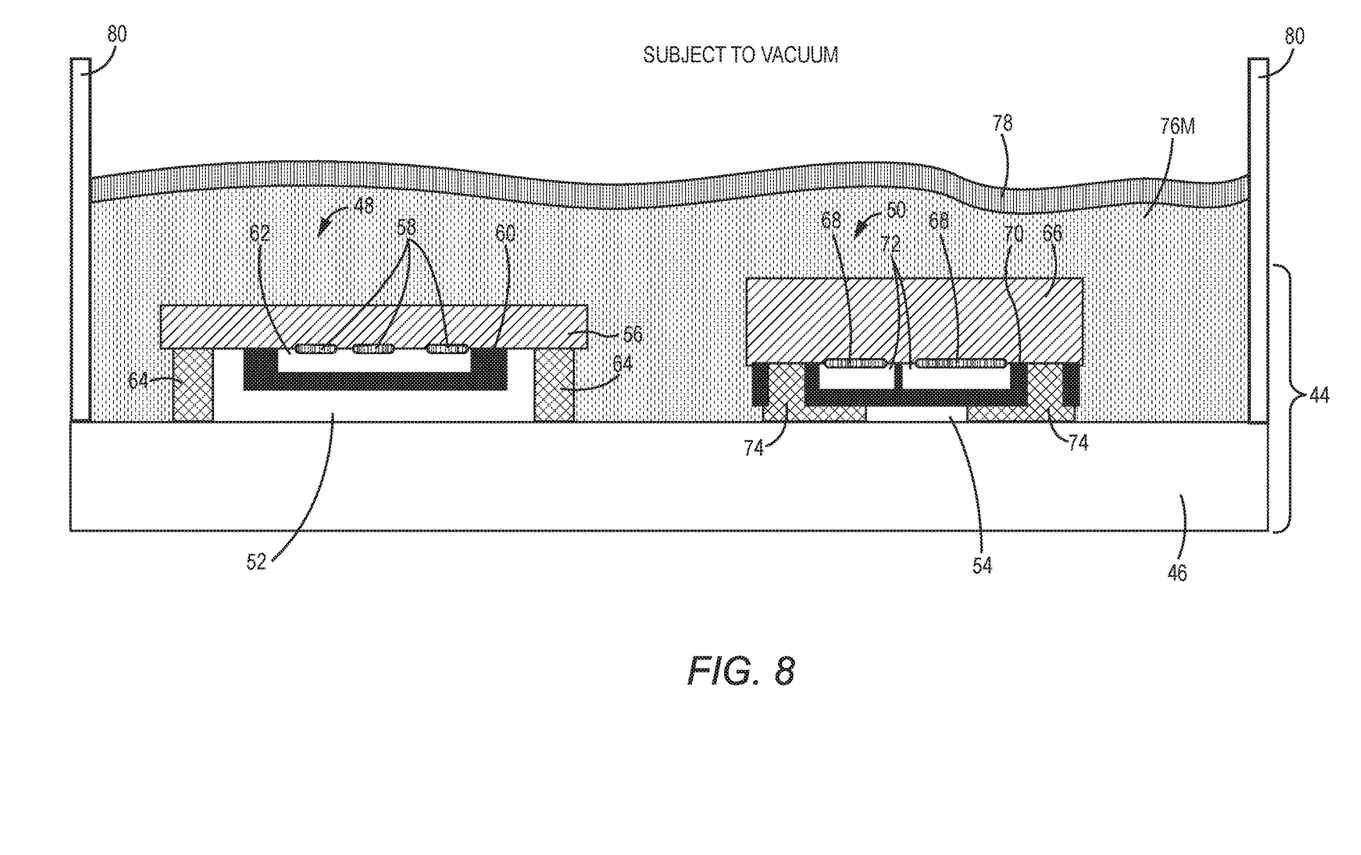
Figure 9:
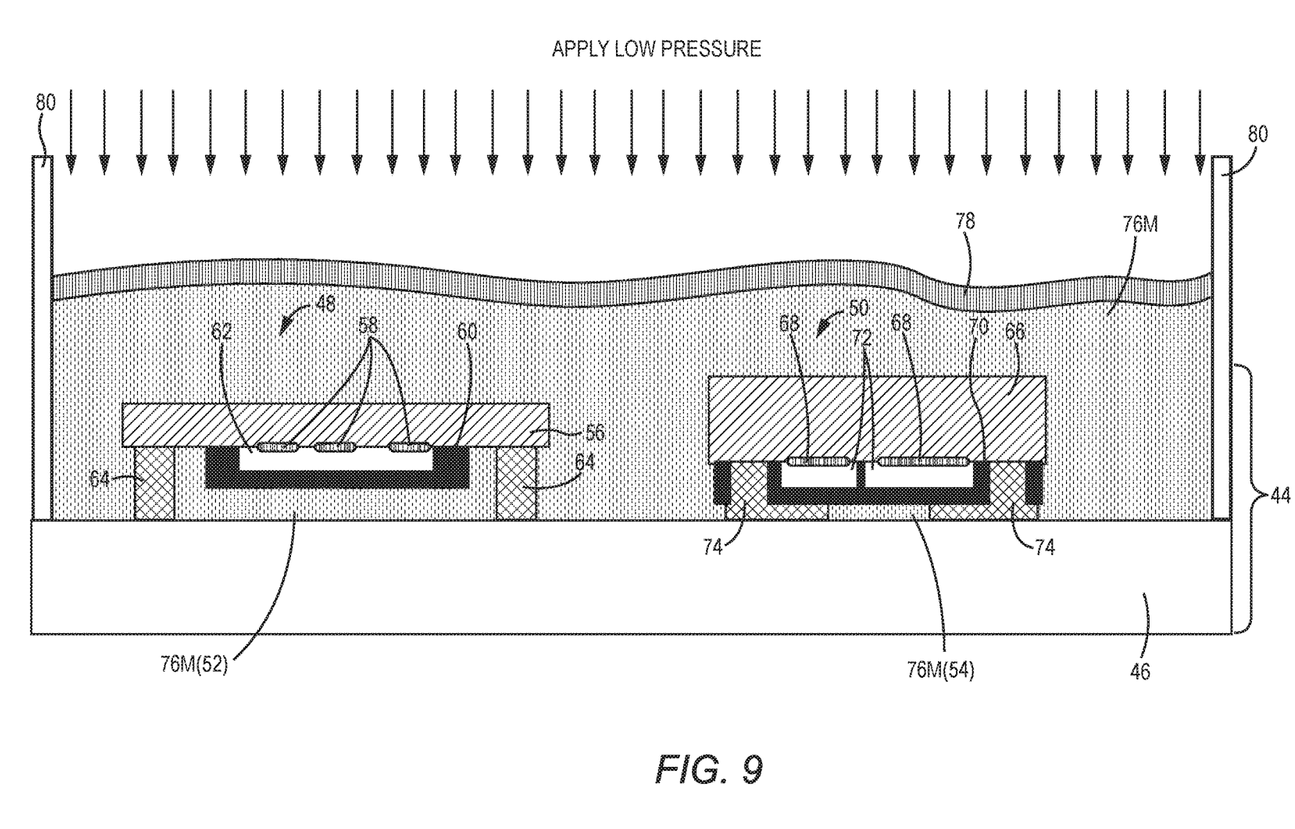

After the heating step, the assembly 44 is subjected to a vacuum (not shown) that creates a negative atmosphere to allow the molten mold compound 76M to flow towards the top surface of the substrate 46 and about the first and the second SMDs 48 and 50 as depicted in FIG. 8 (Step 112). In addition, air between the molten mold compound 76M and the top surface of the substrate 46 is evacuated in the vacuuming step. Next, the molten mold compound 76M is pressed toward the top surface of the substrate 46 as depicted in FIG. 9 (Step 114). Heat, at a temperature between 120° C. and 180° C. may be also applied during the pressing step. In different applications, pressing the molten mold compound 76M toward the top surface of the substrate 46 may get pressure from a top side of the assembly 44, a bottom side of the assembly 44, or both the top and bottom sides of the assembly 44. Due to the high flow feature, the molten mold compound 76M may be pressed to substantially fill the first space 52 (between the first SMD 48 and the top surface of the substrate 46) and the second space 54 (between the second SMD 50 and the top surface of the substrate 46) at a low pressure between 0.5 Mpa and 2 Mpa. Herein, substantially filling the first space 52 refers to filling at least 95% of the entire first space 52, and substantially filling the second space 54 refers to filling at least 95% of the entire second space 54. As such, the first and the second SMDs 48 and 50 are substantially encapsulated by the molten mold compound 76M. Because of the low pressure, the first WLP structure 60 having the first roof 60-2 with a thickness less than 25 μm, and the second WLP structure 70 having the second roof 70-3 with a thickness less than 25 μm will not collapse. The first and the second electronic components 58 and 68 are still exposed to the first and second sealed cavities 62 and 72, respectively. Note that the low pressure process enables the thin WLP structures, but does not require the thin WLP structures. Thus, the low pressure process may also be used in assemblies with thick WLP structures. Pressing the molten mold compound 76M may be provided by a bladder press.

Figure 10:
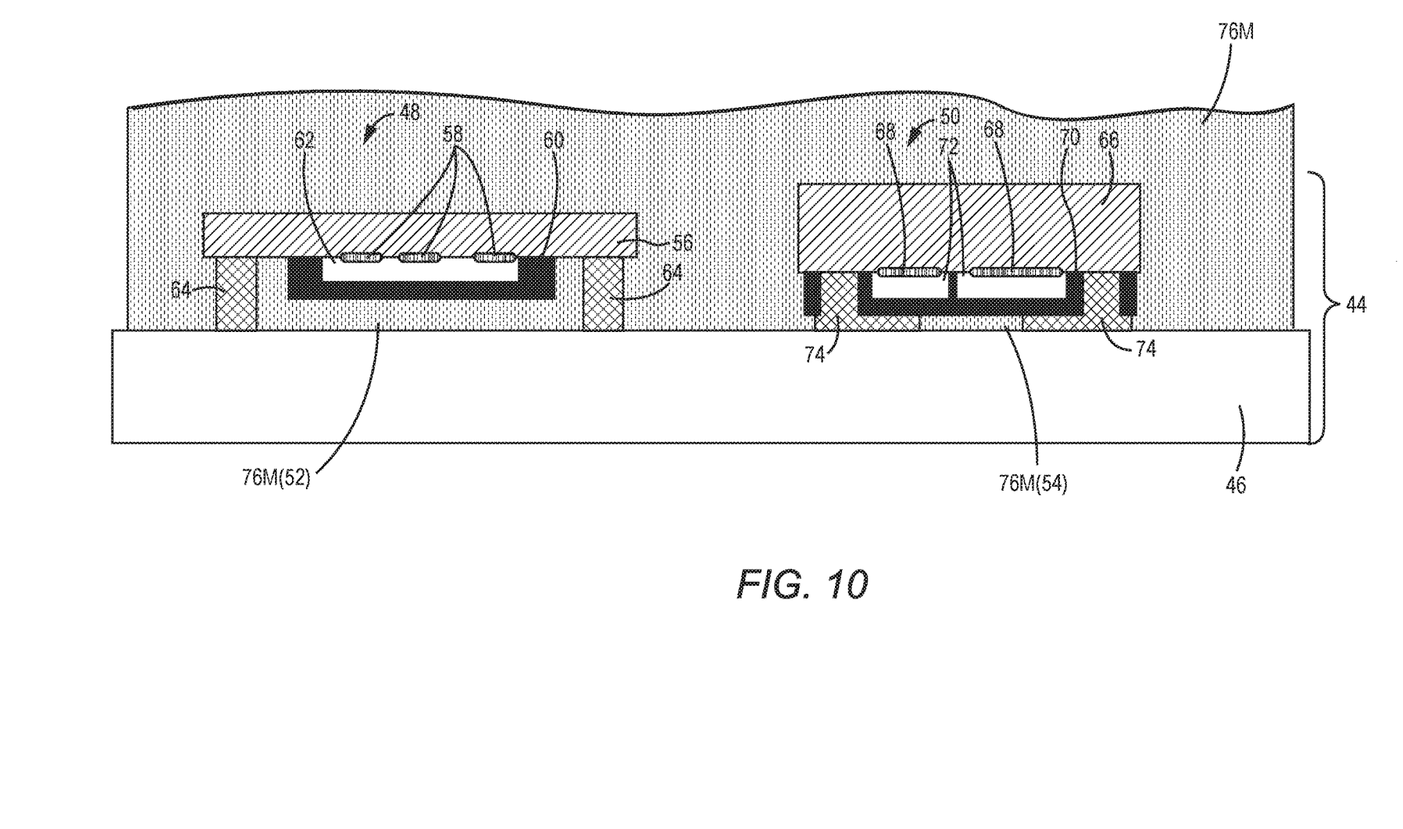
Figure 11:
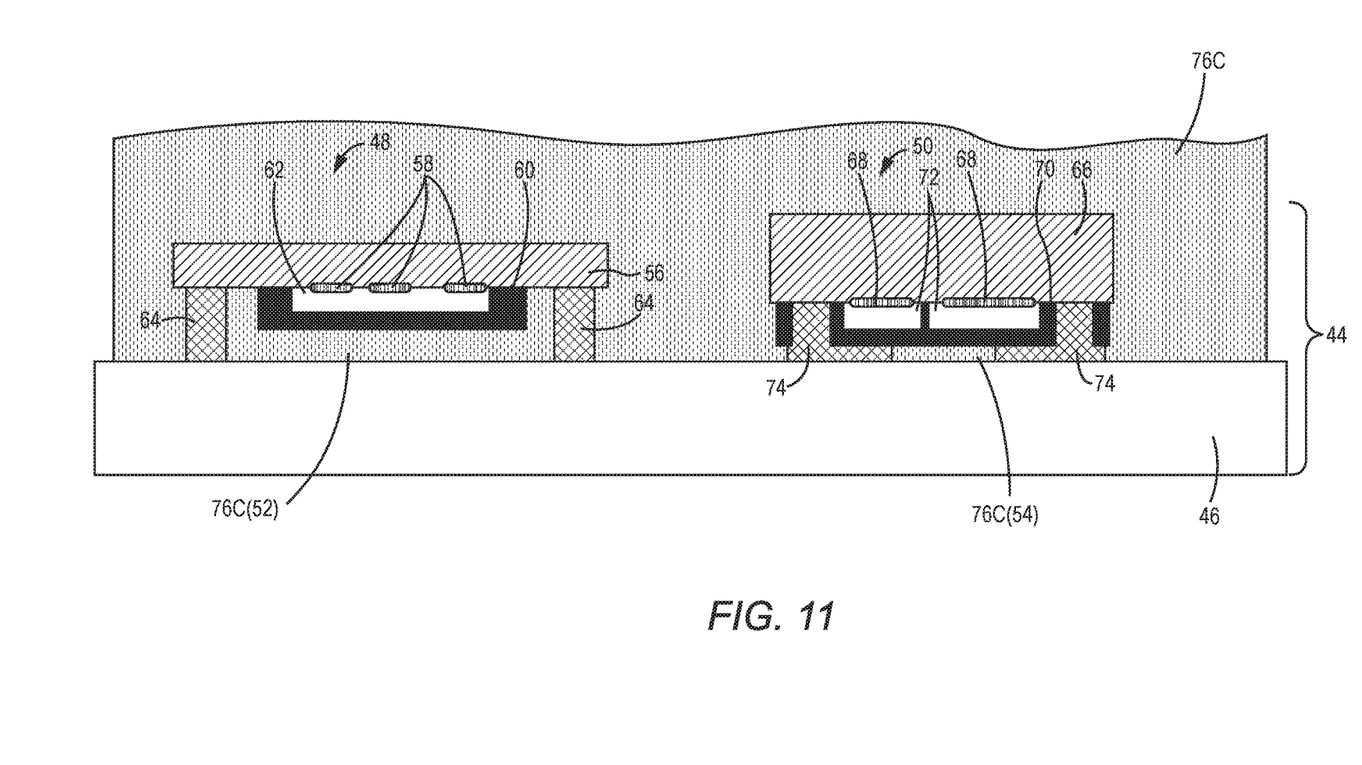

After the assembly 44 cools down (Step 116), the film assisting material 78 and the perimeter walls 80 are removed as depicted in FIG. 10 (Step 118). The molten mold compound 76M is then cured to provide a cured mold compound 76C as depicted in FIG. 11 (Step 120). The cured mold compound 76C provides mechanical support to the first and the second interconnect structures 64 and 74. The normal curing temperature is between 150° C. and 200° C. The curing temperature may be higher or lower depending on which material is used as the sheet mold compound 76.

Figure 12:
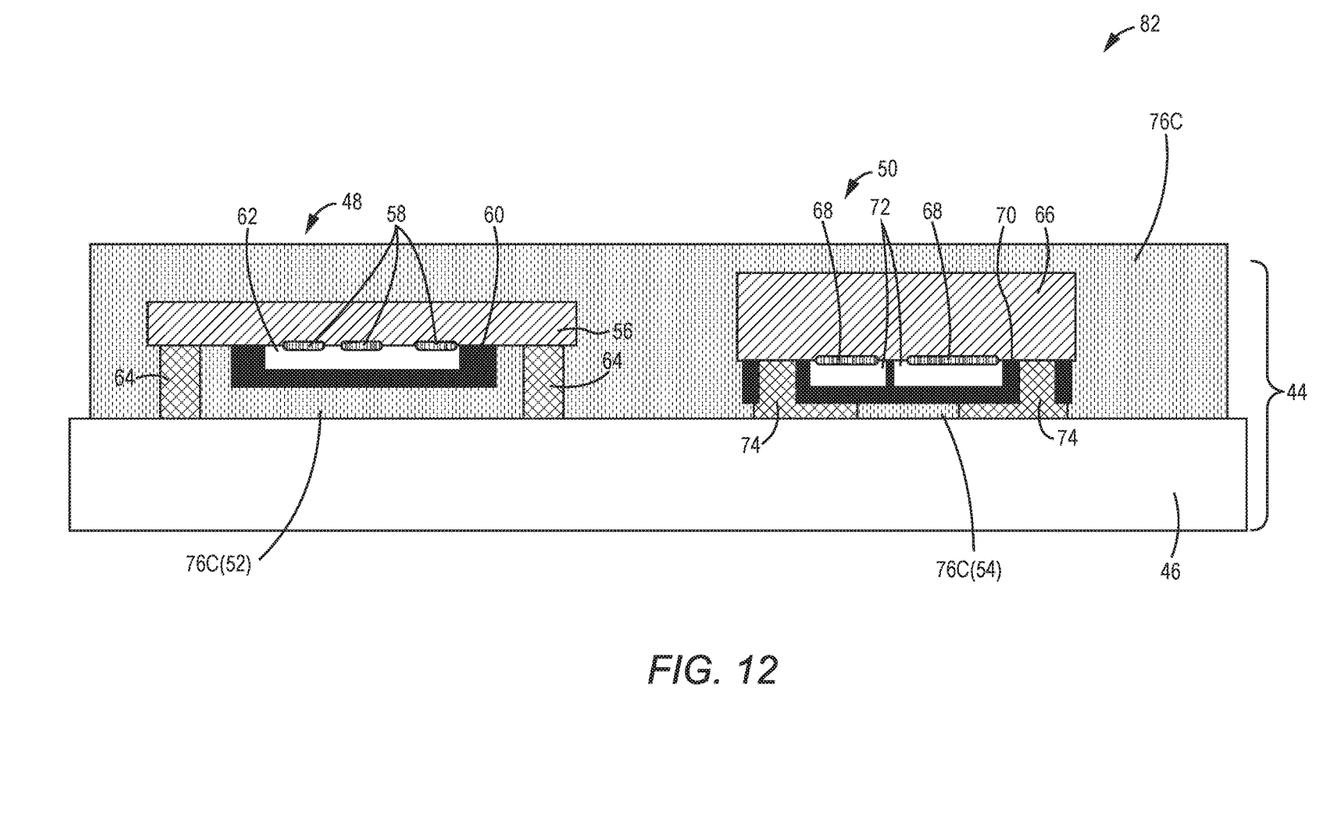

Finally, a top surface of the cured mold compound 76C is planarized as depicted in FIG. 12 (Step 122). Planarizing the top surface of the cured mold compound 76C may be provided by grinding the top surface of the cured mold compound 76C.

Those skilled in the art will recognize improvements and modifications to the embodiments of the present disclosure. All such improvements and modifications are considered within the scope of the concepts disclosed herein and the claims that follow.

What is claimed is:

1. A method comprising:
    providing an assembly comprising a substrate having a top surface, a surface mounted device (SMD) mounted on the top surface of the substrate, and a space between the SMD and the top surface of the substrate, wherein the SMD has at least one sealed cavity that is biased towards the top surface of the substrate;
    laying a sheet mold compound over the SMD and portions of the top surface of the substrate about the SMD;
    heating the assembly such that the sheet mold compound transitions to a liquid phase to form a molten mold compound;
    subjecting the assembly to a vacuum that creates a negative atmosphere to allow the molten mold compound to flow towards the top surface of the substrate and about the SMD;
    pressing the molten mold compound toward the top surface of the substrate at a low pressure such that the space between the SMD and the top surface of the substrate is substantially filled and the SMD is substantially encapsulated, wherein the low pressure is no more than 2 Mpa;
    curing the molten mold compound to provide a cured mold compound; and
    planarizing a top surface of the cured mold compound.

2. The method of claim 1 wherein a depth of the at least one sealed cavity of the SMD is between 15 µm and 25 µm.

3. The method of claim 1 wherein the SMD includes a flip-chip die and a wafer level packaged (WLP) structure at a bottom surface of the flip-chip die, wherein the at least one sealed cavity is formed between the bottom surface of the flip-chip die and the WLP structure.

4. The method of claim 3 wherein the WLP structure comprises outer walls and a roof, wherein the outer walls reside at the bottom surface of the flip-chip die biased towards the top surface of the substrate and the roof covers the outer walls to form the at least one sealed cavity.

5. The method of claim 4 wherein a thickness of the roof is between 20 µm and 45 µm.

6. The method of claim 3 wherein the WLP structure is formed from photosensitive permanent resist film.

7. The method of claim 3 wherein the flip-chip die is a bulk acoustic wave (BAW) filter die.

8. The method of claim 7 wherein a height of the SMD is between 190 µm and 210 µm.

9. The method of claim 3 wherein the flip-chip die is a surface acoustic wave (SAW) filter die.

10. The method of claim 9 wherein a height of the SMD is between 220 µm and 280 µm.

11. The method of claim 1 wherein the sheet mold compound comprises a thermoset epoxy resin with silica particles, wherein each of the silica particles has a maximum size no larger than 20 µm.

12. The method of claim 1 further comprising placing perimeter walls on liquid phase, such that the molten mold compound is prevented from flowing beyond the periphery of the substrate.

13. The method of claim 12 further comprising removing the perimeter walls.

14. The method of claim 1 further comprising applying a film assisting material over the sheet mold compound before heating the assembly, wherein the film assisting material does not melt during the heating step.

15. The method of claim 14 wherein the film assisting material comprises a polyethylene terephthalate (PET) material that has a higher melting point than the sheet mold compound.

16. The method of claim 14 further comprising removing the film assisting material before grinding the top surface of the cured mold compound.

17. The method of claim 1 further comprising cooling the assembly after pressing the molten mold compound toward the top surface of the substrate.

18. The method of claim 1 wherein the assembly is heated at a temperature between 120° C. and 180° C.

19. The method of claim 1 wherein the pressure is no less than 0.5 Mpa.

20. The method of claim 1 wherein pressing the molten mold compound toward the top surface of the substrate is provided by a bladder press.

21. The method of claim 1 wherein pressing the molten mold compound is processed with heat between 120° C. and 180° C.

22. The method of claim 1 wherein the sheet mold compound is cured at a temperature between 150° C. and 200° C.

* * * * *

UNITED STATES PATENT AND TRADEMARK OFFICE
CERTIFICATE OF CORRECTION

| | | |
|---|---|---|
| PATENT NO. | : 9,646,857 B2 | Page 1 of 1 |
| APPLICATION NO. | : 15/236586 | |
| DATED | : May 9, 2017 | |
| INVENTOR(S) | : Howard Terry Glascock et al. | |

It is certified that error appears in the above-identified patent and that said Letters Patent is hereby corrected as shown below:

In the Claims

Please replace:

"12. The method of claim 1 further comprising placing perimeter walls on liquid phase, such that the molten mold compound is prevented from flowing beyond the periphery of the substrate."

With:

--12. The method of claim 1 further comprising placing perimeter walls on peripheries of the substrate before heating the sheet mold compound into the liquid phase, such that the molten mold compound is prevented from flowing beyond the periphery of the substrate.--

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*